United States Patent
Hsu et al.

(10) Patent No.: US 12,048,084 B2
(45) Date of Patent: Jul. 23, 2024

(54) COVERING FILM, AND CIRCUIT BOARD AND MANUFACTURING METHOD

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Hsiao-Ting Hsu, New Taipei (TW); Ming-Jaan Ho, New Taipei (TW); Katsumi Fujiwara, Shenzhen (CN); Fu-Yun Shen, Shenzhen (CN); Fu-Wei Zhong, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 299 days.

(21) Appl. No.: 17/637,133

(22) PCT Filed: Mar. 27, 2020

(86) PCT No.: PCT/CN2020/081624
§ 371 (c)(1),
(2) Date: Feb. 22, 2022

(87) PCT Pub. No.: WO2021/189411
PCT Pub. Date: Sep. 30, 2021

(65) Prior Publication Data
US 2023/0038731 A1 Feb. 9, 2023

(51) Int. Cl.
*H05K 1/02* (2006.01)
*H05K 1/03* (2006.01)

(52) U.S. Cl.
CPC ......... *H05K 1/0209* (2013.01); *H05K 1/0353* (2013.01); *H05K 1/028* (2013.01)

(58) Field of Classification Search
CPC .... H05K 1/0209; H05K 1/028; H05K 1/0353; H05K 1/02; H05K 1/03; H05K 2201/066; H05K 3/4635
USPC ........................................................ 174/258
See application file for complete search history.

(56) References Cited

U.S. PATENT DOCUMENTS

2011/0039134 A1* 2/2011 Kim .................... H01M 10/637
429/7
2018/0290425 A1* 10/2018 Mondal .................... D04B 1/16

FOREIGN PATENT DOCUMENTS

| CN | 102105019 A | 6/2011 |
| CN | 202319173 U | 7/2012 |
| CN | 204047017 U | 12/2014 |
| CN | 209322776 U | 8/2019 |

(Continued)

*Primary Examiner* — Timothy J Thompson
*Assistant Examiner* — Guillermo J Egoavil
(74) *Attorney, Agent, or Firm* — ScienBiziP, P.C.

(57) ABSTRACT

A covering film (100) includes a first covering layer (10), a first adhesive layer (20), and a thermal conductive layer (30) sandwiched between the first covering layer (10) and the first adhesive layer (20). A thermal conductivity of the thermal conductive layer (30) is K1, K1 is in a range of 3 W/m.K to 65 W/m.K. A thermal conductivity of the first covering layer (10) is K2, K2 is in a range of 0.02 W/m.K to 3.0 W/m.K. A thermal conductivity of the first adhesive layer (20) is K3, K3 is in a range of 0.02 W/m.K to 1.0 W/m.K. A circuit board and its manufacturing method are also provided.

12 Claims, 5 Drawing Sheets

(56) References Cited

FOREIGN PATENT DOCUMENTS

JP 2013159097 A * 8/2013 ............... H05K 1/03

* cited by examiner

COVERING FILM, AND CIRCUIT BOARD AND MANUFACTURING METHOD

FIELD

The subject matter herein generally relates to a covering film, a circuit board, and a manufacturing method of the circuit board.

BACKGROUND

Flexible circuit boards are widely used in mobile phones and other electronic products as transmission lines for high frequency signals. To save space and facilitate the layout of wiring, a flexible circuit board is usually set to be in direct contact with a shell of a battery. However, the transmission quality of high frequency signals may be decreased with the increase of temperature. The battery may generate a lot of heat when being used for a long time, and a portion of the heat is directly delivered into the flexible circuit board. Thus, the transmission quality of high frequency signals in the flexible circuit board is affected.

SYMBOL DESCRIPTION OF MAIN COMPONENT

Figure 1:
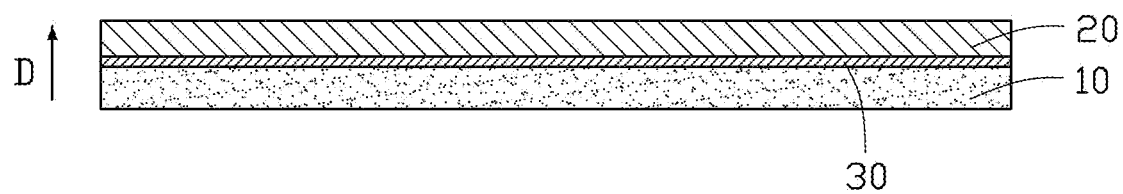
FIG. 1 is a cross-sectional view of a covering film according to the present disclosure.

Covering film 100, first covering layer 10, first adhesive layer 20, thermal conductive layer 30, substrate 40, first wiring layer 50, second wiring layer 60, second covering film 70, second adhesive layer 71, second covering layer 72, steel plate 80, conductive adhesive layer 90, hole 91, circuit board 200, 300, inner substrate 201, thickness direction D of covering film.

Implementations of the present technology will now be described, by way of embodiments, with reference to the attached figures.

DETAILED DESCRIPTION

Implementations of the disclosure will now be described, by way of embodiments only, with reference to FIGS. 1 to 5. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are not to be considered as limiting the scope of the embodiments.

Referring to FIG. 1, the present disclosure provides a covering film 100, which includes a first covering layer 10, a first adhesive layer 20, and a thermal conductive layer 30 sandwiched between the first covering layer 10 and the first adhesive layer 20. A thermal conductivity of the thermal conductive layer 30 is K1, and K1 is in a range of 3 W/m.K to 65 W/m.K. A thermal conductivity of the first covering layer 10 is K2, and K2 is in a range of 0.02 W/m.K to 3.0 W/m.K. A thermal conductivity of the first adhesive layer 20 is K3, and K3 is in a range of 0.02 W/m.K to 1.0 W/m.K. In use, the first covering layer 10 contacts with a heat source (for example, a battery shell of a mobile phone) and delivers heat to the thermal conductive layer 30 along a thickness direction D of the covering film 100. The heat quickly passes through the thermal conductive layer 30 along an extending direction of the covering film 100. Thus, local accumulation of the heat is avoided, which can reduce the heat transferred to the first adhesive layer 20.

In the embodiment, the thermal conductive layer 30 comprises a base material and first thermal conductive powders dispersed in the base material. The base material is used to fill gaps between the first thermal conductive powders, and further to bond the first thermal conductive powders together and form a layered structure.

In the embodiment, the base material is polyimide. The first thermal conductive powders are at least one of graphene and carbon nanotubes. In other embodiments of the present disclosure, the first thermal conductive powders may also be at least one of carbon powders, carbon fibers, silver powders, and copper powders. The base material may also be at least one of epoxy resin, phenolic resin, polyether ether ketone, and polyurethane.

In the embodiment, an outer surface of the graphene or carbon nanotube is bonded with polar groups (such as oxygen groups, or amino groups formed after surface modification). The polar groups are used to increase a bonding force between the thermal conductive layer 30 and the first covering layer 10 or between the thermal conductive layer 30 and the first adhesive layer 20.

In the embodiment, the first covering layer 10 includes polyimide and second thermal conductive powders. The second thermal conductive powders include at least one of alumina powders, aluminum nitride powders, silicon carbide powders, and boron nitride powders. The second thermal conductive powders are used to enhance the thermal conductivity of the first covering layer 10. At the same time, the second thermal conductive powders can reduce a thermal expansion coefficient of the first covering layer 10, reduce shape deformation, and maintain the size stability of the covering film 100.

In the embodiment, the first adhesive layer 20 includes epoxy resin.

In the embodiment, a thickness of the first covering layer 10 is in a range of 7.5 μm to 25 μm. A thickness of the first adhesive layer 20 is in a range of 5 μm to 50 μm. A thickness of the thermal conductive layer 30 is in a range of 3 μm to 15 μm. In other embodiments of the present disclosure, the thicknesses of the first covering layer 10, the first adhesive layer 20, and the thermal conductive layer 30 can also be other ranges to meet actual requirements.

The present disclosure further provides a manufacturing method of a circuit board 200. The manufacturing method includes following steps.

Figure 2:
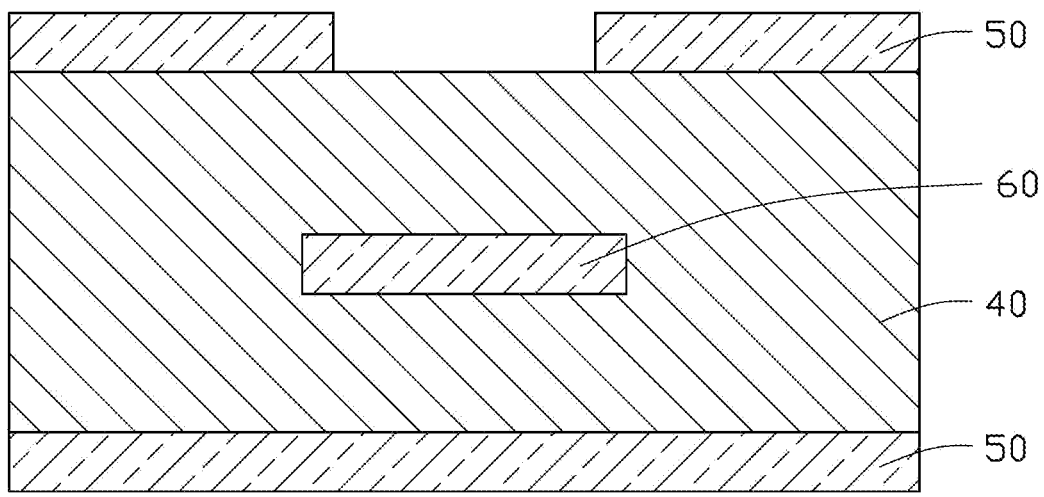
FIG. 2 is a cross-sectional view of an inner substrate according to the present disclosure.

S1: referring to FIG. 2, an inner substrate 201 is provided, which includes a substrate 40, two first wiring layers 50 disposed on the substrate 40, and a second wiring layer 60 inside the substrate 40.

Figure 3:
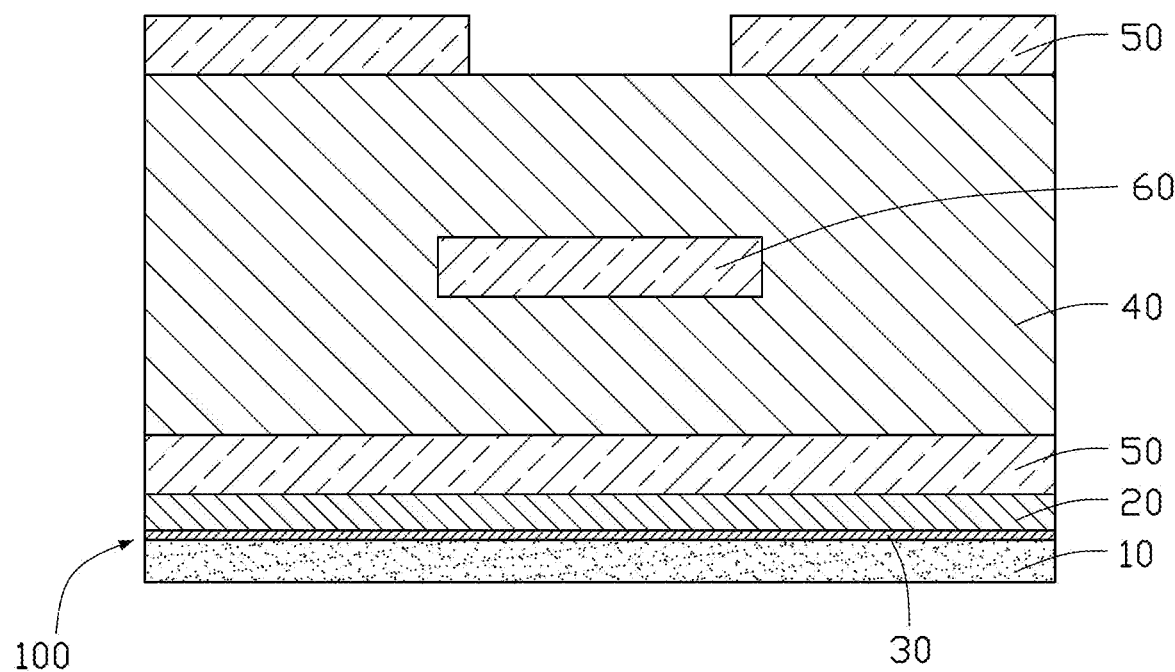
FIG. 3 is a cross-sectional view of the covering film covered with the inner substrate in FIG. 2.

S2: referring to FIG. 3, a first covering film is formed on one of the first wiring layers 50, and the first covering film is the above described covering film 100. The first adhesive layer 20 is in direct contact with the first wiring layer 50.

Figure 4:
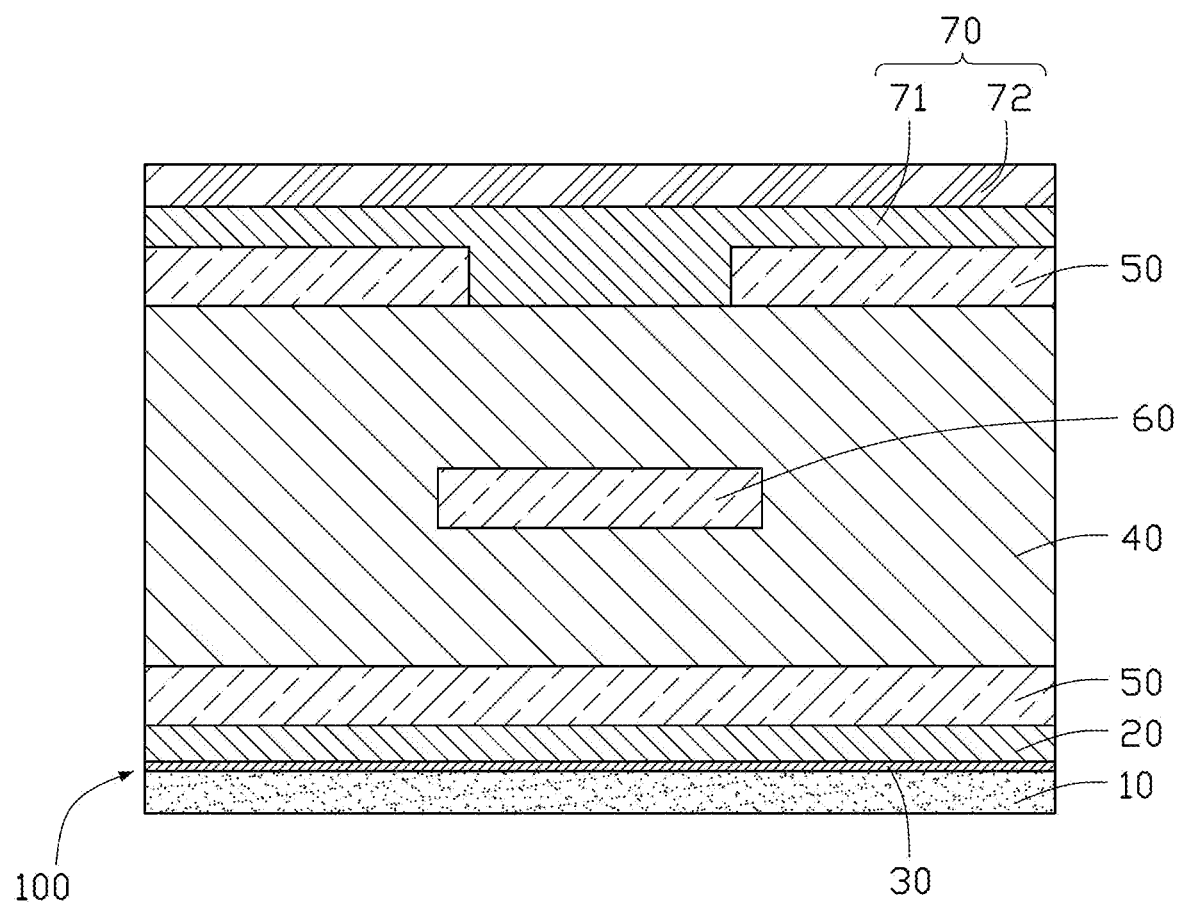
FIG. 4 is a cross-sectional view of a circuit board formed by covering another covering film on the inner substrate in FIG. 3.

S3: referring to FIG. 4, a second covering film 70 is formed on the other one of the first wiring layers 50 to obtain the circuit board 200. The second covering film 70 includes a second adhesive layer 71 disposed on the first wiring layer 50 and a second covering layer 72 disposed on the second adhesive layer 71. Then, the circuit board 200 is obtained.

In the embodiment, the second adhesive layer 71 includes epoxy resin. The second covering layer 72 includes at least one of polyimide, epoxy resin, phenolic resin, polyether ether ketone, and polyurethane.

In the embodiment, at step S1, the first wiring layer 50 is a ground layer, and the second wiring layer 60 is a signal layer.

Figure 5:
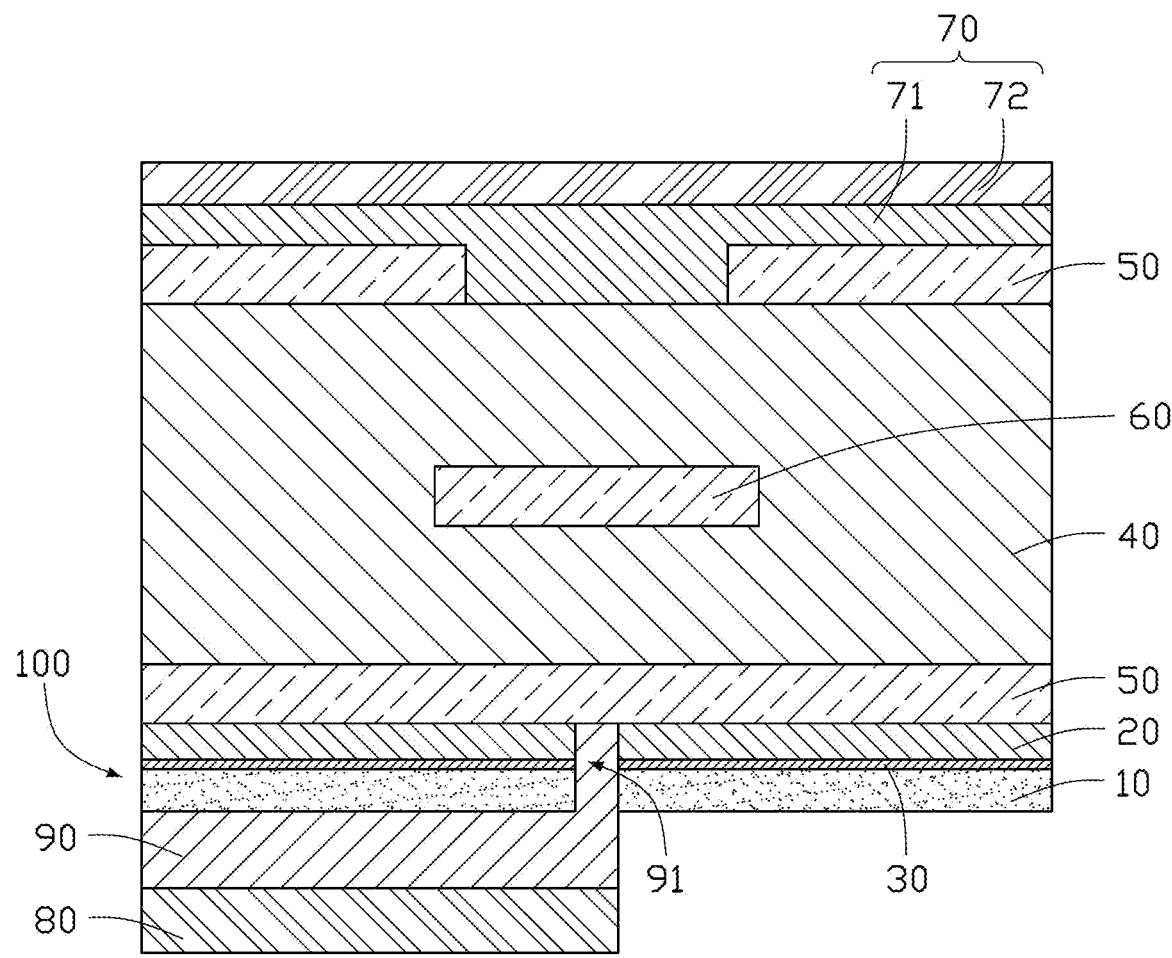
FIG. 5 is a cross-sectional view of another embodiment of a circuit board according to the present disclosure.

In another embodiment of the present disclosure, referring to FIG. 5, step S2 also includes forming a steel plate 80 on the first covering layer 10. The steel plate 80 is bonded to the first covering layer 10 by a conductive adhesive layer 90, and is used to enhance the structural strength of the circuit board 200.

Furthermore, step S2 also includes drilling a hole 91 in the covering film 100. The hole 91 connects the steel plate 80 to the first wiring layer 50. A portion of the conductive adhesive layer 90 is filled in the hole 91, to cause the first wiring layer 50 to be electrically connected to the steel plate 80. Finally, a circuit board 300 is obtained. By electrically connecting the first wiring layer 50 to the steel plate 80, impedance matching can be satisfied, and dithering signals generated, in such a stacking configuration can be avoided.

Referring to FIG. 4, the present disclosure further provides a circuit board 200, which includes an inner substrate 201, a covering film 100 disposed on a surface of the inner substrate 201 and a second covering film 70 disposed on an opposite surface of the inner substrate 201. The inner substrate 201 comprises a substrate 40, two first wiring layers 50 disposed on the substrate 40, and a second wiring layer 60 inside the substrate 40.

The second covering film 70 comprises a second adhesive layer 71 disposed on the first wiring layer 50 and a second covering layer 72 disposed on the second adhesive layer 71.

The covering film 100 comprises a first covering layer 10, a first adhesive layer 20, and a thermal conductive layer 30 sandwiched between the first covering layer 10 and the first adhesive layer 20. The thermal conductivity of the thermal conductive layer 30 is K1, and K1 is in a range of 3 W/m.K to 65 W/m.K. The thermal conductivity of the first covering layer 10 is K2, and K2 is in a range of 0.02 W/m.K to 3.0 W/m.K. The thermal conductivity of the first adhesive layer 20 is K3, and K3 is in a range of 0.02 W/m.K to 1.0 W/m.K. The first adhesive layer 20 is in direct contact with the first wiring layer 50.

Since the circuit board of the present disclosure includes the covering film, by arranging the first covering layer to be in contact with the heat source, the heat can be transmitted to the thermal conductive layer along the thickness direction of the covering film. The heat can also quickly pass through the thermal conductive layer along the extending direction of the covering film. Thus, local accumulation of the heat can be avoided, which also reduces the heat transferred to the first adhesive layer. Finally, the present disclosure can reduce deterioration of signal transmission quality caused by heat absorption and temperature rise.

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A covering film, comprising:
   a first covering layer;
   a first adhesive layer; and
   a thermal conductive layer sandwiched between the first covering layer and the first adhesive layer, wherein the thermal conductive layer comprises a base material and first thermal conductive powders dispersed in the base material,
   wherein a thermal conductivity of the thermal conductive layer is K1, K1 is in a range of 3 W/m.K to 65 W/m.K; a thermal conductivity of the first covering layer is K2, K2 is in a range of 0.02 W/m.K to 3.0 W/m.K; and a thermal conductivity of the first adhesive layer is K3, K3 is in a range of 0.02 W/m.K to 1.0 W/m.K.

2. The covering film of claim 1, wherein the base material comprises at least one of polyimide, epoxy resin, phenolic resin, polyether ether ketone, and polyurethane; the first thermal conductive powders comprise at least one of graphene, carbon fibers, carbon powders, carbon nanotubes, and silver powders; an outer surface of the graphene or the carbon nanotubes is bonded with polar groups.

3. The covering film of claim 1, wherein the first covering layer comprises polyimide and second thermal conductive powders, the second thermal conductive powders comprise at least one of alumina powders, aluminum nitride powders, silicon carbide powders, and boron nitride powders.

4. The covering film of claim 1, wherein a thickness of the first covering layer is in a range of 7.5 μm to 25 μm, a thickness of the first adhesive layer is in a range of 5 μm to 50 μm, and a thickness of the thermal conductive layer is in a range of 3 μm to 15 μm.

5. A manufacturing method of a circuit board, comprising
   providing an inner substrate, comprising a substrate, two first wiring layers disposed on two opposite surfaces of the substrate, and a second wiring layer inside the substrate; and
   forming a first covering film on one of the two first wiring layers, the first covering film comprising a first covering layer, a first adhesive layer, and a thermal conductive layer sandwiched between the first covering layer and the first adhesive layer, wherein the thermal conductive layer comprises a base material and first thermal conductive powders dispersed in the base material, a thermal conductivity of the thermal conductive layer is K1, K1 is in a range of 3 W/m.K to 65 W/m.K; a thermal conductivity of the first covering layer is K2, K2 is in a range of 0.02 W/m.K to 3.0 W/m.K; a thermal conductivity of the first adhesive layer is K3, K3 is in a range of 0.02 W/m.K to 1.0 W/m.K; the first adhesive layer is directly in contact with the one of the two first wiring layers.

6. The manufacturing method of the circuit board of claim 5, further comprising:

forming a second covering film on the other one of the two first wiring layers, the second covering film comprising a second adhesive layer disposed on the other one of the two first wiring layers and a second covering layer disposed on the second adhesive layer.

7. The manufacturing method of the circuit board of claim 5, further comprising:
forming a steel plate on the first covering layer, wherein the steel plate and the first covering layer are bonded together by a conductive adhesive layer.

8. The manufacturing method of the circuit board of claim 7, further comprising:
defining a hole in the first covering film, wherein the hole connects the steel plate to the one of the two first wiring layers, a portion of the conductive adhesive layer is filled in the hole to allow the one of the two first wiring layers to electrically connect to the steel plate.

9. A circuit board, comprising:
an inner substrate; and
a covering film disposed on a surface of the inner substrate,
wherein the inner substrate comprises a substrate, two first wiring layers disposed on two opposite surfaces of the substrate, and a second wiring layer inside the substrate, and
wherein the covering film comprises a first covering layer, a first adhesive layer, and a thermal conductive layer sandwiched between the first covering layer and the first adhesive layer; the thermal conductive layer comprises a base material and first thermal conductive powders dispersed in the base material, a thermal conductivity of the thermal conductive layer is K1, K1 is in a range of 3 W/m.K to 65 W/m.K; a thermal conductivity of the first covering layer is K2, K2 is in a range of 0.02 W/m.K to 3.0 W/m.K; a thermal conductivity of the first adhesive layer is K3, K3 is in a range of 0.02 W/m.K to 1.0 W/m.K, and the first adhesive layer is in direct contact with one of the two first wiring layers.

10. The circuit board of claim 9, wherein the base material comprises at least one of polyimide, epoxy resin, phenolic resin, polyether ether ketone, and polyurethane; the first thermal conductive powders comprise at least one of graphene, carbon fibers, carbon powders, carbon nanotubes, and silver powders; an outer surface of the graphene or the carbon nanotubes is bonded with polar groups.

11. The circuit board of claim 9, wherein the first covering layer comprises polyimide and second thermal conductive powders, the second thermal conductive powders comprise at least one of alumina powders, aluminum nitride powders, silicon carbide powders, and boron nitride powders.

12. The circuit board of claim 9, wherein a thickness of the first covering layer is in a range of 7.5 μm to 25 μm, a thickness of the first adhesive layer is in a range of 5 μm to 50 μm, and a thickness of the thermal conductive layer is in a range of 3 μm to 15 μm.

* * * * *